United States Patent [19]
Grabbe et al.

[11] 4,449,770
[45] May 22, 1984

[54] SOCKETLESS SEPARABLE CONNECTOR

[75] Inventors: Dimitry G. Grabbe, Lisbon Falls, Me.; Iosif Korsunsky, Harrisburg, Pa.

[73] Assignee: AMP Incorporated, Harrisburg, Pa.

[21] Appl. No.: 266,399

[22] Filed: May 22, 1981

[51] Int. Cl.³ .......................................... H01R 23/72
[52] U.S. Cl. ......................... 339/17 CF; 339/75 MP; 339/176 MP
[58] Field of Search .......... 339/17 CF, 75 M, 75 MP, 339/176 MP; 174/52 FP

[56] References Cited

U.S. PATENT DOCUMENTS

| | | | |
|---|---|---|---|
| 3,335,327 | 8/1967 | Damon et al. | 339/17 CF |
| 3,663,920 | 5/1972 | Lapham et al. | 339/176 MP |
| 3,874,768 | 4/1975 | Cutchaw | 339/75 M |
| 4,164,003 | 8/1979 | Cutchaw | 339/17 CF |

FOREIGN PATENT DOCUMENTS 1436512 5/1976 United Kingdom .......... 339/17 CF

Primary Examiner—John McQuade
Attorney, Agent, or Firm—Donald M. Boles

[57] ABSTRACT

A connector for connecting leads from an integrated circuit package to a printed circuit board or the like wherein the connection between the circuit board and the semiconductor chip leads are as short as possible. This is accomplished by providing a frame which abuts the chip carrier and leads extending therefrom whereby the leads are formed over a frame and travel in a direct path to pads on the printed circuit board. Spring members are held in the frame by a yoke, there being one spring element for each lead which forces the chip carrier leads against the printed circuit pad directly thereby obtaining the shortest possible path.

4 Claims, 5 Drawing Figures

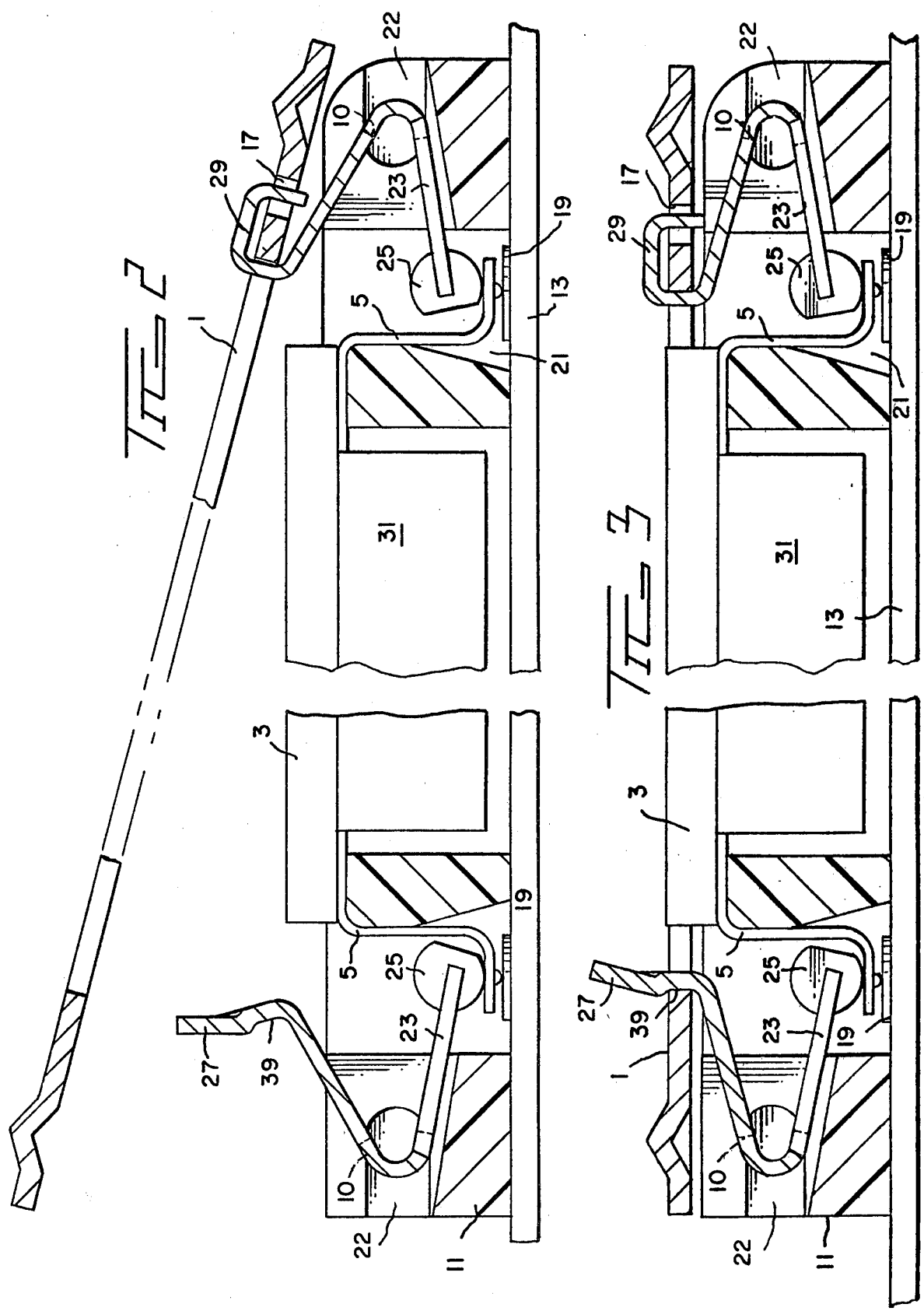

U.S. Patent  May 22, 1984  Sheet 3 of 3  4,449,770
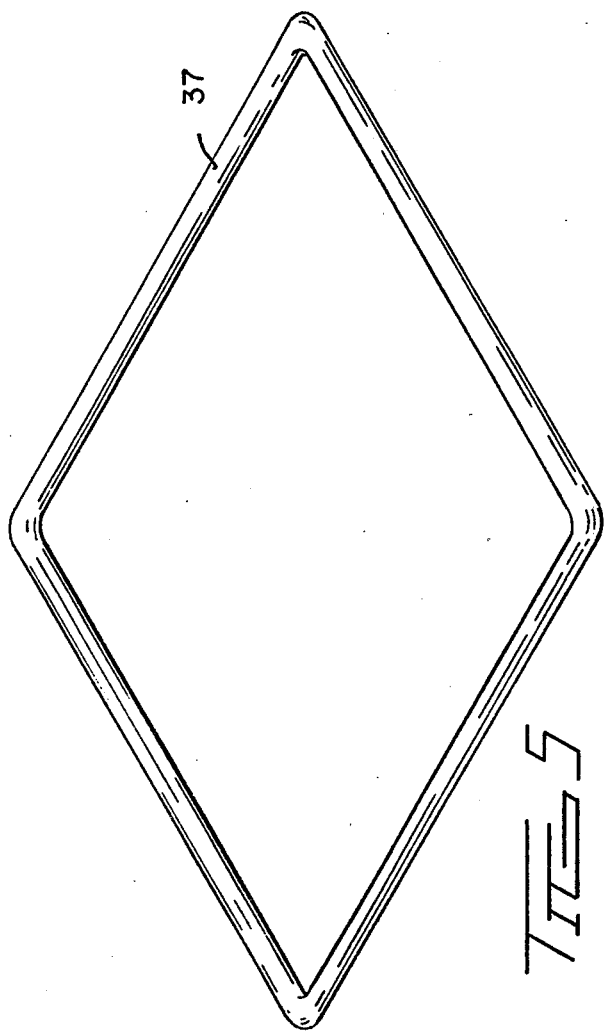
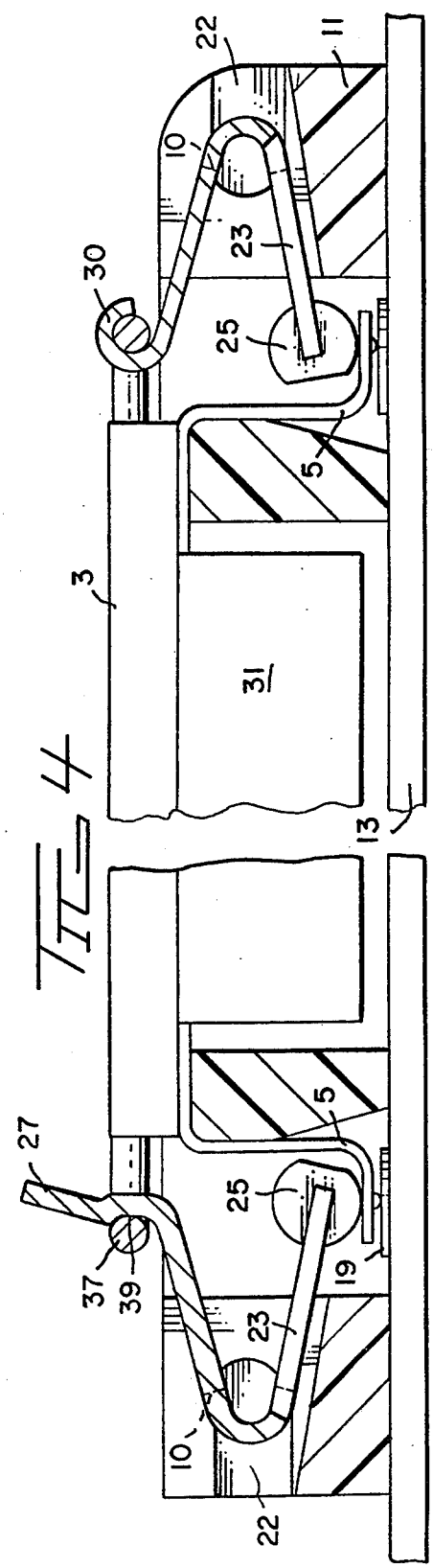

SOCKETLESS SEPARABLE CONNECTOR

BACKGROUND OF THE INVENTION

1. Field of the Invention

This invention relates to socketless separable connectors for chip carriers for semiconductor chips for providing the shortest possible path between pads on the printed circuit board and the leads on the chip carrier.

2. Description of the Prior Art

Semiconductor chips, such as integrated circuits, are normally mounted on chip carriers as is well known in the prior art. These chip carriers include ceramic elements or other insulating material upon which the chips are mounted, with lead frames extending from pads on the chips to the exterior of the chip carrier for interconnection with elements or the outside world such as, for example, printed circuit boards. The prior art chip carriers have functioned very satisfactorily for their intended purpose in the past. However, the speed of operation of the circuits has increased and continues to increase. Since the chip carriers themselves are normally formed of ceramic materials and the like which are good dielectrics, the semiconductor packages have built-in capacitance and self-inductance in the leads required for the bonding pads on the chips for connection to the external world. These capacitances and inductances are a function of frequency and increase as the speed of operation increases. The increase in system inductance and capacitance decreases the speed at which the circuits are capable operating. These capactances and inductances also appear in the sockets which connect the packages to integrated circuit boards and the like. It is desirable to increase the operating speed of electronic components and, for this reason, it is necessary to decrease the bulit-in capacitance and self-inductance in the semiconductor chip package as well as the sockets therefore.

It is known that, the longer the leads, the greater will be the built-in capacitance and self-inductance. It is therefore the desire to provide a connection between the leads on a chip carrier and the pads of an associated printed circuit board which are as short as possible with elimination of sockets to minimize inductive and capacitive properties when making connection to a pad on a printed circuit board or the like from a lead on a semiconductor chip carrier.

SUMMARY OF THE INVENTION

In accordance with the present invention there is provided a connector for connecting leads from an integrated circuit package to a printed circuit board or the like wherein the connection between the circuit board and the semiconductor chip leads are as short as possible. This is accomplished by providing a frame which abuts the chip carrier and leads extending therefrom whereby the leads are formed over a frame and travel in a direct path to pads on the printed circuit board. Spring members are held in the frame by a yoke or the like, there being one spring element for each lead which forces the chip carrier leads against the printed circuit pad directly thereby obtaining the shortest possible path.

BRIEF DESCRIPTION OF THE DRAWINGS

FIG. 2 is a sectional view of the connector of FIG. 1 in partially assembled state;

FIG. 3 is a cross-sectional view of the connector of FIG. 1 in fully assembled state;

FIG. 4 is a cross-sectional view of an electrical connector in accordance with a second embodiment of the present invention;

FIG. 5 is a three dimensional view of a yoke as used in the embodiment of FIG. 4 in accordance with the present invention;

DESCRIPTION OF THE PREFERRED EMBODIMENTS

Figure 1:
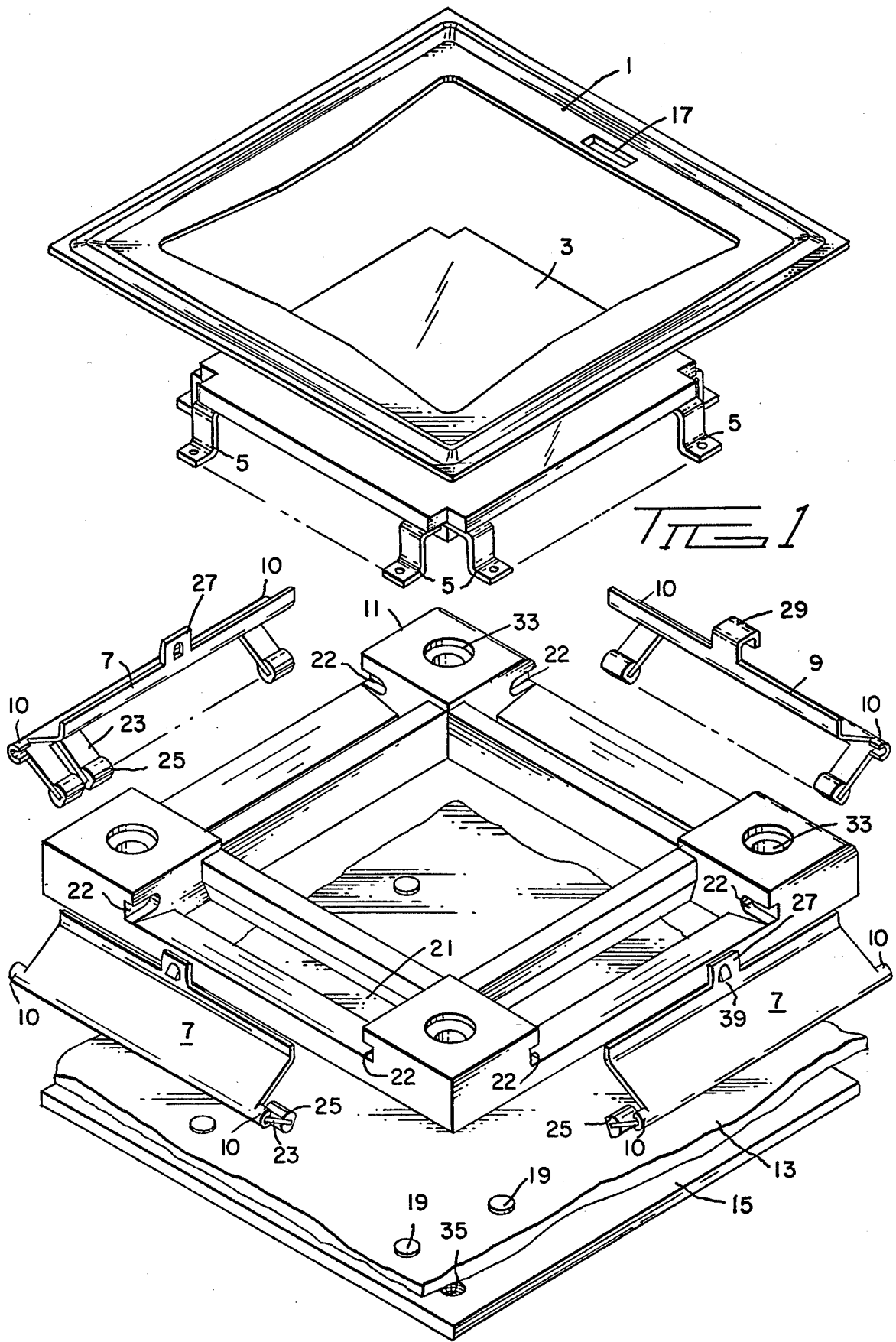
FIG. 1 is an exploded view of a socketless separable connector in accordance with the first embodiment of the present invention.

Referring first to FIGS. 1 thru 3, there is shown a first embodiment of a socketless separable connection and connector in accordance with the present invention. The embodiment includes a backing layer 15 upon which a printed circuit board 13 is positioned, there being conductive paths 19 or pads positioned about the periphery of the printed circuit board. A frame 11 is positioned on the printed circuit board, the frame including grooves 21 therethrough extending to the printed circuit board and positioned about the pads 19 and recesses 22 contained in the corners of the frame 11 at each end of the grooves 21. Spring members 7 and 9 are provided, each of the spring members having spring elements 23 with insulated tips 25 which apply a downward force upon leads 5 connected to a chip 31 mounted on the ceramic chip carrier 3. There is one spring element 23 for each lead 5, the spring elements and leads being aligned with pads 19 on the printed circuit board. It should be further noted that each of the spring elements 7 has an upwardly extending finger 27 at its center portion whereas the spring member 9 has a U-shaped finger 29 for reasons to be described hereinbelow while each of the spring members 7, 9 have tabs 10 at each end thereof. The leads 5 pass through the grooves 21 to contact associated pads 19 and the spring elements 23 and tips 25 also pass through grooves 21 and rest above the leads 5. A yoke 1 with a groove 17 for receiving the U-shaped finger 29 is provided for applying an appropriate force on the spring members 7 and 9 whereby they are retained within the frame 11 and provide a force against the leads 5 against the pads 19 via the spring elements 23. The frame 11 is secured to the backing member 15 by means of nuts and bolts or the like (not shown) which would pass through the apertures 33 of the frame 11 and the apertures 35 of the backing member 15 to lock all of the elements together in the manner shown in FIGS. 2 and 3. The printed circuit board 13 can also have apertures through which the above mentioned nuts and bolts pass.

In operation, the backing member, printed circuit board 13, frame 11 and spring members 7 and 9 will be properly positioned with the chip carrier 3 as shown and threaded and secured together by means of nuts and bolts or the like passing through the apertures 33 and 35 as described above. The yoke 1 will then be positioned over the finger 29 and then brought over the fingers 27 as partially shown initially in FIG. 2, whereby the groove 17 will be positioned so that the U-shaped finger 29 will pass through the aperture in the yoke and around into the groove 17. This will align the yoke 1 to the spring member 9. Since the distance from the finger 29 to the finger 27 which opposes finger 29 will be slightly greater than the distance across the aperture in the yoke 1, when the yoke is moved downwardly over this finger 27 as shown in FIG. 3, these finger members 27 and 29 will be drawn toward each other and provide the downward force from the spring 23 onto the lead 5 and pad 19. It can be seen that each of the fingers 27 includes a groove 39 to retain the yoke 1 therein. Also evident is how the tabs 10 contained at each end of the spring members 7, 9 cooperate with the recesses 22 thereby retaining the spring members 7 and 9 in the frame 11. This will place the lead 5 into compression against the pad 19. It should also be noted that the opposing spring members are also positioned in the frame 11 whereby the two remaining and opposing fingers 27 thereof are separated by a distance slightly greater than the distance across the aperture in the yoke 1. In this way, when the yoke is moved from the position shown in FIG. 2 to that shown in FIG. 3, the opposing spring members 7 will also be placed into compression against the leads 5 and pads 19 in the same manner as noted above for opposing spring members 7 and 9.

It can be seen that the embodiment of FIGS. 1 thru 3 provides a separable connection for a semiconductor chip 31 to pads of a printed circuit board 13, the leads 5 traversing the shortest possible distance from the ceramic chip carrier 3 to the pads 19 and requiring no socket.

Referring now to FIGS. 4 and 5, there is shown a second embodiment of the invention. In this embodiment all of the elements are identical to the elements of the embodiments of FIGS. 1 thru 3 except that the yoke 1 has been replaced by a yoke 37 in the form of a square rigid element and the rectangular finger 29 of FIGS. 1 to 4 has been replaced by an open circular shaped finger 30. In this case of the embodiment of FIGS. 5 and 6, the square yoke 37 is positioned so that one of its sides is disposed in the open part of the finger 30 with the remaining sides of the yoke 37 extending outside of the fingers 27 and forcing them inwardly as shown in FIG. 5. It can be seen that each of the fingers 27 includes a groove 39 to retain the yoke 37 therein. In operation, the yoke 37 will be positioned in the circle 30 of the finger and then be forced over each of the fingers 27 to draw all of the fingers 27 and 30 inwardly and apply the downward force in the same manner as described with respect to the embodiment of FIGS. 1 thru 3.

It can be seen that there have been provided a plurality of embodiments for placing a lead from a ceramic chip carrier into compressive relation with a pad on a printed circuit board, the lead traversing the shortest possible distance between the chip carrier and the paid with no socket being required.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A separable electrical connector, comprising:
 a semiconductor chip carrier having leads extending therefrom;
 a frame adjacent to said carrier, said leads extending through said frame;
 circuit board means adjacent to said frame and having electrically conductive pads thereon in alignment with said leads, each of said leads being disposed on one of said pads;
 a spring means disposed on each side of said frame, said spring means having a plurality of electrically insulating tips for engaging each of said leads so as to cause said leads to be compressed against the pads thereby providing electrical communication between said leads and said pads, said spring means further having a finger extending upward from said spring means for engagable engaging a yoke means;
 yoke means pivotally attached to one of said fingers for engaging remaining said fingers so as to cause said spring members and thereby said tips to exert a contact-mating force between said leads and said pads.

2. A device according to claim 1 wherein said spring means has a tab disposed at each end thereof for engaging with a recess contained in said frame, thereby pivotally attaching said spring means to said frame.

3. A device according to claim 1 wherein said spring means is comprised of a substantially U-shaped member said tips extending from one end thereof for engaging with said leads.

4. A device according to claim 1 wherein said spring means is comprised of an electrically-conductive spring member with an electrically-insulating material disposed on each of said tips.

* * * * *